(12) United States Patent
Aoki et al.

(10) Patent No.: US 6,468,357 B1
(45) Date of Patent: Oct. 22, 2002

(54) REMOVER FOR A RUTHENIUM CONTAINING METAL AND USE THEREOF

(75) Inventors: Hidemitsu Aoki; Kaori Watanabe; Norio Ishikawa; Kiyoto Mori, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/123,197

(22) Filed: Apr. 17, 2002

Related U.S. Application Data

(62) Division of application No. 09/788,555, filed on Feb. 21, 2001.

(30) Foreign Application Priority Data

Feb. 23, 2000 (JP) ......................................... 2000-046150

(51) Int. Cl.[7] ................................................. C23G 1/02
(52) U.S. Cl. .............................. 134/3; 134/2; 134/25.5; 134/26; 134/28; 134/32; 134/33; 134/34; 134/36; 134/41; 134/42; 134/902; 510/175; 510/245

(58) Field of Search .................................. 510/175, 245; 134/3, 2, 25.5, 26, 28, 32, 33, 36, 41, 42, 34, 902

(56) References Cited

U.S. PATENT DOCUMENTS

| 4,080,246 A | 3/1978 | Battitsi et al. ............... 156/656 |
| 4,725,375 A | 2/1988 | Fujii et al. .................. 252/79.4 |
| 6,143,192 A | 11/2000 | Westmoreland ............. 216/101 |

FOREIGN PATENT DOCUMENTS

| JP | 64-086524 | 3/1989 |
| JP | 11-131263 | 5/1999 |
| US | 2001/0023701 A1 | * 9/2001 |
| US | 2001/0024852 A1 | * 9/2001 |

* cited by examiner

Primary Examiner—Sharidan Carrillo
(74) Attorney, Agent, or Firm—Young & Thompson

(57) ABSTRACT

A method for removing a ruthenium-containing metal includes the step of applying a remover to a semiconductor substrate. The remover includes a cerium (IV) nitrate salt and nitric acid.

12 Claims, 1 Drawing Sheet

REMOVER FOR A RUTHENIUM CONTAINING METAL AND USE THEREOF

This application is a division of co-pending application No. 09/788,555, filed on Feb. 21, 2001, the entire contents of which are hereby incorporated by reference.

BACKGROUND OF THE INVENTION

1. Field of the Invention

This invention relates to a remover for a ruthenium containing metal which is effective for removing an undesired ruthenium containing metal adhering to, for example, a semiconductor substrate and the use thereof.

2. Description of the Related Art

Recently, a high dielectric-constant film such as $Ta_2O_5$ has been used in place of a conventional silicon oxide or nitride film as a capacitance film for a DRAM or FeRAM. Such a high dielectric-constant film permits us to ensure a required accumulated capacitance in a small occupied area and to improve a degree of memory-cell integration.

When using such a high dielectric-constant film and polysilicon as an electrode material sandwiching a capacitance film, oxygen is liberated from the high dielectric-constant film during heating a semiconductor device to oxidize the electrode material. There, therefore, exists a dielectric film (silicon oxide film) having a lower dielectric constant than the high dielectric-constant film between the electrode materials, leading to reduction in a capacitance. Thus, when using a high dielectric-constant film, it is important to select a material which does not become an insulating film due to oxidation as an electrode material sandwiching a capacitance film. It is because once a part of an electrode becomes an insulating film by oxidation, it constitutes a part of a capacitance film, resulting in a reduced capacitance. Ruthenium has recently attracted attention as an electrode material meeting the above requirement. Ruthenium is preferable because it retains conductivity even after oxidation, thus does not cause capacitance reduction and is inexpensive.

However, forming an electrode using ruthenium may lead to peeling of a ruthenium containing metal such as ruthenium and ruthenium oxide adhering to the end face or the rear face of a silicon substrate. The peeled metal may adhere to a device forming area or may cause cross contamination between devices or wafers via a carrying system. Recently, a procedure such as forming an electrode film within a narrow hole has been frequently employed for reducing an occupied area for a capacitor. It requires even forming of a thin ruthenium film, so that it is often essential to use CVD exhibiting good coverage as a deposition method, where adhesion of the ruthenium containing metal to the end and/or the rear faces of the silicon substrate becomes more prominent.

A ruthenium containing metal is known as a so-called lifetime killer to a semiconductor device. In particular, it may cause a variety of problems; for example, it adversely affects device operation due to reduction in carrier mobility and varying a threshold voltage of a transistor with time. A ruthenium containing metal is diffused at a higher rate in a silicon substrate than platinum also known as a lifetime killer. A trace amount of the ruthenium containing metal remaining on the silicon substrate surface may give prominent adverse affects on device properties. As described above, an undesired ruthenium containing metal remaining on a silicon substrate surface may deteriorate reliability of a device.

Therefore, when using ruthenium as an electrode material, it is important to remove an undesired ruthenium containing metal by treatment with an etchant. There have been, however, no etchants capable of dissolving and removing a ruthenium containing metal. For example, aqua regia used for forming a platinum electrode may not be used as a remover for a ruthenium containing metal due to its insufficient dissolving ability.

For effectively removing a ruthenium containing metal, a remover for ruthenium must not only dissolve the ruthenium containing metal but also effectively preventing the dissolved ruthenium containing metal from re-adhering to a silicon substrate.

SUMMARY OF THE INVENTION

In the light of the above situation, an objective of this invention is to provide a remover for a ruthenium containing metal which can adequately dissolve and remove a ruthenium containing metal such as ruthenium and ruthenium oxide and can satisfactorily prevent re-adhesion of the dissolved ruthenium containing metal, and the use thereof.

This invention provides a remover for a ruthenium containing metal, comprising (a) a cerium (IV) nitrate salt and (b) at least one acid selected from the group consisting of nitric acid, perchloric acid and acetic acid.

The remover of this invention exhibits prominent performance of removing a ruthenium containing metal owing to synergism in the combination of components (a) and (b) and can satisfactorily prevent re-adhesion of the dissolved ruthenium containing metal.

This remover may be used for washing a substrate to which a ruthenium containing metal adheres or for etching a ruthenium film formed on a substrate.

The remover of this invention is particularly suitable for removing ruthenium adhering to a semiconductor device (by washing or etching). As described above, ruthenium is known as a so-called lifetime killer to a semiconductor device. It may give serious damage to device performance when remaining on the surface of the semiconductor device. The remover according to this invention may efficiently remove a ruthenium containing metal and prevent re-adhesion so that it is suitable for removing the ruthenium containing metal on such a semiconductor substrate.

The remover of this invention is particularly effective when used for washing a semiconductor substrate in which a ruthenium containing metal adheres to an area other than a device forming area. For example, it may be significantly effective when used for removing by washing a ruthenium containing metal adhering to an area other than a device forming area after depositing a ruthenium film in the device forming area on the semiconductor substrate. In such washing, the ruthenium containing metal adhering the area other than the device forming area is mainly made of ruthenium oxide. The remover of this invention may exhibit good performance of removal and re-adhesion prevention for not only ruthenium but also ruthenium oxide. Thus, it may be suitably used for the above washing. For such washing, a particularly higher level of performance is required for preventing re-adhesion of the dissolved and removed ruthenium containing metal in comparison with, for example, etching. The remover of this invention exhibiting excellent performance of preventing re-adhesion may be suitably used in the above washing. The term "an area other than a device forming area" includes end and rear faces of a semiconductor substrate and also peripheral areas in the device forming area.

As described above, the remover of this invention is characterized in that a cerium (IV) nitrate salt is combined with a particular acid.

For a composition in which a cerium (IV) nitrate salt and an acid is combined, JP-B 7-7757 and JP-A 11-131263 have described that used as an etchant for preparing a chrome mask. When preparing the chrome mask, it is necessary to etch a chromium film such that its cross section becomes tapered. It is known that such a taper shape may be suitably formed by conducting wet etching using a composition having the above combination after forming a resist mask on a chromium film because chromium is dissolved by the action of a cerium (IV) nitrate salt while nitric acid peels the resist mask and the chromium film.

These publications have, however, described etching chromium and there are no description for action to a ruthenium containing metal.

As described above, it has been unknown that a combination of a cerium (IV) nitrate salt and a particular acid exhibits excellent performance in removing a ruthenium containing metal and may effectively prevent re-adhesion of the removed ruthenium containing metal. This invention is based on the observation.

This invention also provides method of using a remover for a ruthenium containing metal wherein a substrate is washed with a liquid containing at least one of hydrofluoric acid, nitric acid, perchloric acid and oxalic acid for removing the residual remover after removing with the above remover.

This process may allow us to effectively remove a residual remover, leading to washing with higher cleanliness.

This invention also provides a process for removing a ruthenium containing metal comprising the steps of depositing a ruthenium film in a device forming area on a semiconductor substrate; and spraying a remover containing (a) a cerium (IV) nitrate salt and (b) at least one acid selected from the group consisting of nitric acid, perchloric acid and acetic acid on a given area on the semiconductor substrate while rotating the substantially horizontal semiconductor substrate to remove a ruthenium containing metal adhering to an area other than the device forming area.

The removing process may more effectively remove a ruthenium containing metal.

DETAILED DESCRIPTION OF THE PREFERRED EMBODIMENTS

Figure 1:
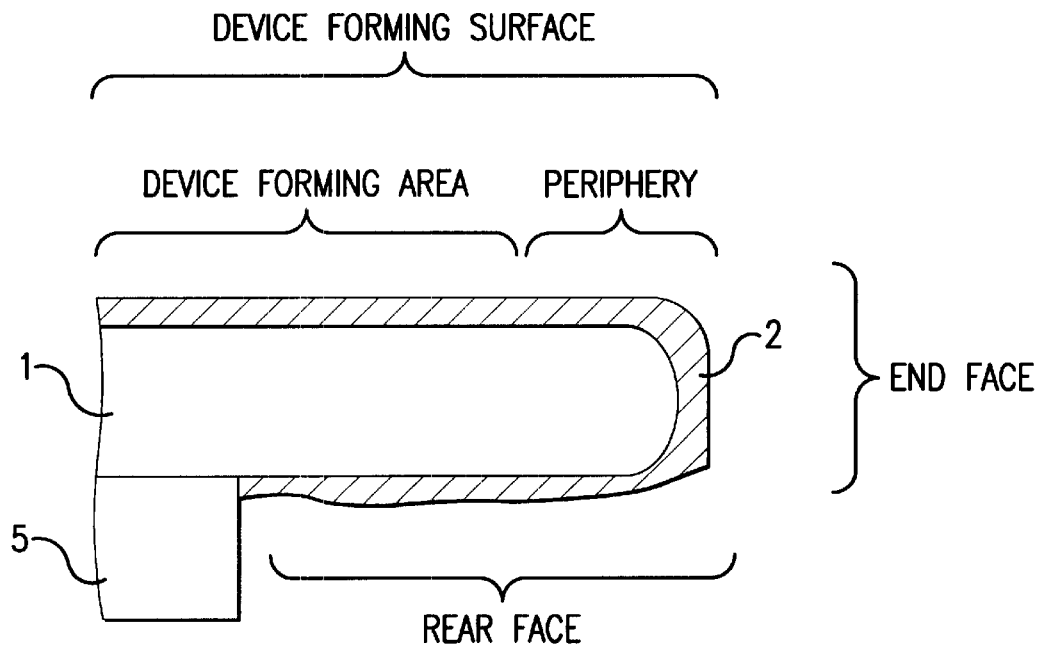
FIG. 1 shows an appearance of a silicon substrate after depositing a ruthenium film.

Component (a) in this invention is a cerium (IV) nitrate salt. Examples of a cerium (IV) nitrate salt include cerium (IV) ammonium nitrate and cerium (IV) potassium nitrate. Cerium (IV) ammonium nitrate is preferable because it less influences device performance.

Component (b) in this invention is at least one acid selected from the group consisting of nitric acid, perchloric acid and acetic acid. In other words, these acids may be used alone or in combination as appropriate. Synergism in a combination of such an acid and component (a) provides prominent effect for removing a ruthenium containing metal.

In this invention, the content of component (a) is preferably 5 wt % or more, more preferably 10 wt % or more, for adequately dissolving and removing a ruthenium containing metal and preventing re-adhesion of the removed ruthenium containing metal. The upper limit of the content is preferably 35 wt % or less, more preferably 30 wt % or less, for effectively preventing precipitation of compound (a).

In this invention, the content of component (b) is preferably 1 wt % or more, more preferably 5 wt % or more, for adequately dissolving and removing a ruthenium containing metal and preventing re-adhesion of the removed ruthenium containing metal. There are no particular restrictions to an upper limit of the content, but it may be, for example, 30 wt % or less.

A remover in this invention exhibits higher performance for removing a ruthenium containing metal and for re-adhesion prevention by means of synergism provided by a combination of the above components (a) and (b). It is difficult to adequately remove a ruthenium containing metal with component (a) or (b) alone.

Besides the above components (a) and (b), a remover in this invention usually contains water as component (c), which may enhance performance of the components (a) and (b) for removing a ruthenium containing metal. The content of component (c) is for example 35 to 94 wt %.

The remover of this invention may contain a variety of additives such as a surfactant and a water-soluble organic solvent, which may be miscible with water and other components in this invention.

A preferable embodiment of a remover in this invention may be one consisting of the above (a), (b) or (c) alone or that to which a small amount of, for example, additive is added.

There will be described treatment using a remover for removing a ruthenium containing metal adhering to an area other than a device forming area on a silicon substrate.

The remover is applied to a portion of a surface of the semiconductor substrate that has the ruthenium-containing metal adhering thereto, wherein the portion is a periphery of a front face of the semiconductor substrate, the periphery being adjacent to an area of the front face in which a semiconductor device is formed, the periphery not having a semiconductor device formed therein, as shown in FIG. 1. The remover is excluded from the area of the front face in which the semiconductor device is formed. The remover can also be applied to a rear face of the semiconductor substrate, on which a semiconductor device is not formed, the rear face being opposite a front face of the semiconductor substrate in which a semiconductor device is formed, as illustrated in FIG. 1. The remover solution can also be applied to a rotating semiconductor substrate, wherein the substrate has a first surface region in which semiconductor devices are formed and a second surface region in which semiconductor devices and not formed and to which the ruthenium-containing metal is adhered. The remover is sprayed onto the second surface region that has the ruthenium containing metal adhering thereto, while being excluded from the first surface region. The semiconductor substrate is rinsed to remove residue of the remover solution from the second surface of the semiconductor substrate. FIG. 1 shows a substrate after depositing a ruthenium film where a silicon substrate 1 is placed on a substrate platform 5. When forming a ruthenium film 2 by CVD, ruthenium adheres to the end and the rear faces of the silicon substrate 1. A part of the ruthenium film 2 then becomes ruthenium oxide due to oxidation. If the semiconductor substrate to which a ruthenium containing metal such as ruthenium oxide and ruthenium adheres is fed to a carrying system, it may cause cross contamination of a deposition apparatus. Furthermore, a ruthenium containing metal tends to adversely affect device properties. For avoiding such a problem, treatment with a remover is effective.

Figure 2:
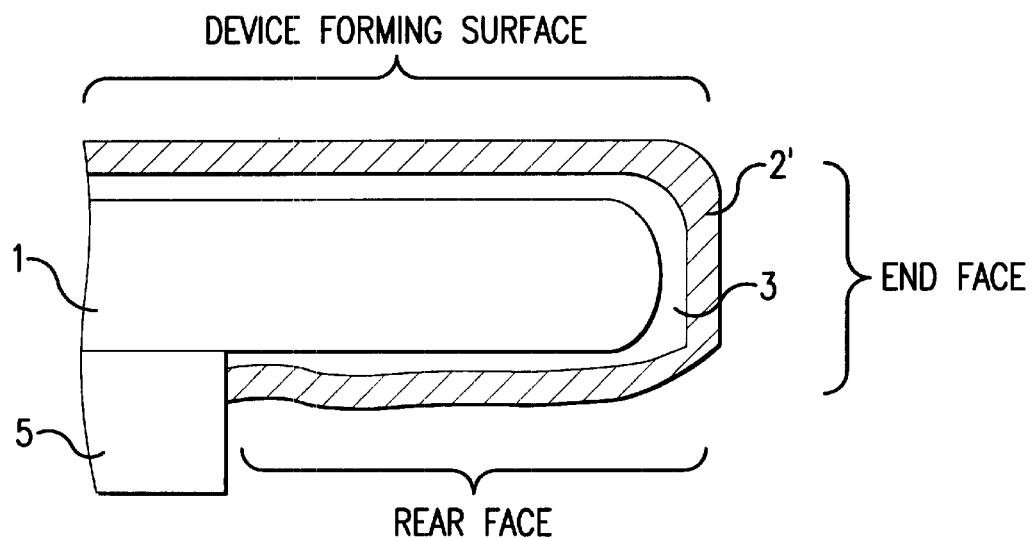
FIG. 2 shows another appearance of a silicon substrate after depositing a ruthenium film.

When forming a ruthenium film 2' after forming an insulating film 3 as illustrated in FIG. 2, the ruthenium film 2' again adheres to the end and the rear faces of the silicon substrate 1. Thus, treatment with the remover of this invention is effective.

It is desirable to avoid adhesion of the remover to the device forming area during conducting a removing process of this invention. For example, a removing procedure may be conducted by spin washing where only the end and the rear faces are in contact with the remover while introducing nitrogen gas to the device forming surface In this invention, examples of a semiconductor substrate include a silicon substrate, a semiconductor substrate made of a III–V group compound such as GaAs, InP and GaN, and a semiconductor substrate made of a II–VI group compound such as ZnSe. Among these, this invention is particularly suitable for treating a silicon substrate because this invention exhibits good performance for removing a ruthenium containing metal and is thus prominently effective when being applied to a silicon substrate where deterioration in device performance due to diffusion of ruthenium in the substrate is significant.

EXAMPLES

Example 1

A silicon substrate on which ruthenium was deposited to a thickness of 100 nm was cut to give an about 2 cm×2 cm chip as a sample. The sample was immersed in a remover consisting of an oxidizing agent, an acid and water. Tables 1 to 7 show compositions of a remover. A content of each component is given in wt % to the whole remover. The balance is water. A temperature of the remover was varied in three steps of 40° C., 50° C. and 60° C. After leaving the sample in the remover until the ruthenium film substantially disappeared, the sample was removed, washed with running water for 1 min and dried with nitrogen blow. A dissolution rate for ruthenium was determined from the time taken until the ruthenium film disappeared. The results are shown in Tables 1 to 7, where a dissolution rate is given in Å/min and "CAN" means cerium (IV) ammonium nitrate.

The results in the tables indicate that effect for removing ruthenium is prominent when a cerium (IV) nitrate salt is combined with a particular acid.

TABLE 1

|  |  | No. 1 | No. 2 | No. 3 | No. 4 |
|---|---|---|---|---|---|
| Oxidizing agent | CAN | 10 | 10 | 10 | 10 |
| Acid | Nitric acid | 0 | 5 | 10 | 30 |
| Dissolution rate Å/min | 40° C. | — | — | — | — |
|  | 50° C. | — | — | — | — |
|  | 60° C. | — | 30 | 27 | 28 |

No. 1 was not evaluated due to clouding during preparation of the remover.

TABLE 2

|  |  | No. 5 | No. 6 | No. 7 | No. 8 | No. 9 |
|---|---|---|---|---|---|---|
| Oxidizing agent | CAN | 20 | 20 | 20 | 20 | 20 |
| Acid | Nitric acid | 0 | 5 | 10 | 20 | 30 |
| Dissolution rate Å/min | 40° C. | 370 | 100 | — | — | 44 |
|  | 50° C. | 280 | 320 | — | — | 95 |
|  | 60° C. | 230 | 470 | 105 | 158 | 146 |

TABLE 3

|  |  | No. 10 | No. 11 | No. 12 | No. 13 |
|---|---|---|---|---|---|
| Oxidizing agent | CAN | 30 | 30 | 30 | 30 |
| Acid | Nitric acid | 0 | 5 | 10 | 20 |
| Dissolution rate Å/min | 40° C. | 430 | 500 | 258 | 172 |
|  | 50° C. | 750 | 650 | 380 | 254 |
|  | 60° C. | 960 | 950 | 522 | 316 |

TABLE 4

|  |  | No. 14 | No. 15 | No. 16 | No. 17 | No. 18 |
|---|---|---|---|---|---|---|
| Oxidizing agent | CAN | 20 | 30 | 30 | 30 | 30 |
| Acid | Perchloric acid | 5 | 5 |  |  |  |
|  | Hydrochloric acid |  |  | 5 |  |  |
|  | Sulfuric acid |  |  |  | 5 |  |
|  | Phosphoric acid |  |  |  |  | 5 |
| Dissolution rate Å/min | 40° C. | 95 | 630 | — | — | — |
|  | 50° C. | 380 | 860 | — | — | — |
|  | 60° C. | 500 | 950 | — | — | — |

No. 16 was not evaluated due to foaming during preparation of the remover.

Nos. 17 and 18 were not evaluated due to precipitation during preparation of the remover.

TABLE 5

|  |  | No. 19 | No. 20 |
|---|---|---|---|
| Oxidizing agent | Cerium sulfate | 20 | 20 |
| Acid | Nitric acid | 5 |  |
|  | Sulfuric acid |  | 5 |
| Dissolution rate Å/min | 40° C. | <10 | <10 |
|  | 50° C. | <10 | <10 |
|  | 60° C. | <10 | <10 |

TABLE 6

|  |  | No. 21 | No. 22 | No. 23 | No. 24 |
|---|---|---|---|---|---|
| Oxidizing agent | Cerium sulfate |  |  | 8 | 8 |
|  | Ferric nitrate | 20 |  |  |  |
|  | Sodium bromate |  | 20 |  |  |
| Acid | Nitric acid | 5 | 5 | 10 |  |
|  | Sulfuric acid |  |  |  | 8 |
| Dissolution rate Å/min | 40° C. | 0 | 0 | <10 | <10 |
|  | 50° C. | 0 | 0 | <10 | <10 |
|  | 60° C. | 0 | 0 | <10 | <10 |

TABLE 7

|  |  | No. 25 | No. 26 |
|---|---|---|---|
| Oxidizing agent | CAN | 30 | 20 |
| Acid | Nitric acid | 5 |  |
|  | Perchloric acid | 5 |  |
|  | Acetic acid |  | 5 |
| Dissolution rate Å/min | 40° C. | 540 | 430 |
|  | 50° C. | 820 | 800 |
|  | 60° C. | 900 | 920 |

Example 2

On a silicon substrate was deposited ruthenium oxide to a thickness of 100 nm and was then formed a resist mask having an opening. The substrate was cut to give an about 2 cm×2 cm chip as a sample. The sample was immersed in a remover consisting of an oxidizing agent, an acid and water. Table 8 shows the composition of the remover. A content of each component is given in wt % to the whole remover. The balance is water. A temperature of the remover was varied in three steps of 40° C., 50° C. and 60° C. After leaving the sample in the remover for a given period, the sample was removed, washed with running water for 1 min and dried with nitrogen blow. A dissolution rate for ruthenium oxide was determined from an immersion time and a reduced film thickness. The results are shown in Tables 8, where a dissolution rate is given in Å/min.

The results in the table indicate that effect for removing ruthenium oxide is prominent when a cerium (IV) nitrate salt is combined with a particular acid.

TABLE 8

|  |  | No. 27 | No. 28 | No. 29 | No. 30 | No. 31 |
|---|---|---|---|---|---|---|
| Oxidizing agent | CAN | 20 | 30 | 30 | 30 | 20 |
| Acid | Nitric acid | 5 | 5 | 10 | 5 |  |
|  | Perchloric acid |  |  |  | 5 |  |
|  | Acetic acid |  |  |  |  | 5 |
| Dissolution rate Å/min. | 40° C. | <10 | <10 | <10 | <10 | <10 |
|  | 50° C. | <10 | 150 | 280 | 350 | 130 |
|  | 60° C. | 370 | 640 | 540 | 590 | 400 |

Example 3

A silicon substrate on which ruthenium was deposited to a thickness of 100 nm was cut to give an about 2 cm×2 cm chip as a sample. The sample was immersed in a remover consisting of an oxidizing agent, an acid and water, where the remover was not stirred or stirred with a stirrer. Table 9 shows the composition of the remover. A content of each component is given in wt % to the whole remover. The balance is water. A temperature of the remover was varied in three steps of 25° C., 30° C. and 40° C. After leaving the sample in the remover until the ruthenium film substantially disappeared, the sample was removed, washed with running water for 1 min and dried with nitrogen blow. A dissolution rate for ruthenium was determined from the time taken until the ruthenium film disappeared. The results are shown in Table 9, where a dissolution rate is given in Å/min. The results indicate that stirring can accelerate dissolution of ruthenium. It may be, therefore, expected that spin washing utilizing physical action can provide more rapid removal than immersing.

TABLE 9

|  | Oxidizing agent | Acid | Stirring | 25° C. | 30° C. | 40° C. |
|---|---|---|---|---|---|---|
| No. 1 | CAN (10) | Nitric acid (5) | No | 100 | 100 | 30 |
|  |  |  | Yes | 800 | 850 | 1000 |
| No. 2 | CAN (10) | Nitric acid (10) | No | 50 | 70 | 100 |
|  |  |  | Yes | 480 | 550 | 600 |
| No. 3 | CAN (20) | Nitric acid (5) | No | 100 | 320 | 470 |
|  |  |  | Yes | 1200 | 1350 | 1700 |
| No. 4 | CAN (20) | Nitric acid (10) | No | 100 | 110 | 150 |
|  |  |  | Yes | 480 | 630 | 960 |

Example 4

A silicon substrate was immersed in a washing, i.e., an aqueous solution of 30 wt % of cerium (IV) ammonium nitrate and 10 wt % of nitric acid, at 40° C. for 5 min. The substrate was removed and determined for an amount of adhering cerium, which was $2.0 \times 10^{13}$ atoms/cm$^2$.

The substrate was immersed in a washing shown in Table 10, removed, washed with running water for 1 min, dried by nitrogen blow and then determined for an amount of adhering cerium. The results are shown in Table 10. A content of each component is given in wt % to the whole washing. The balance is water. An amount of adhering cerium was determined by total-reflection X-ray fluorescence spectroscopy. The results shown in the table indicate that a washing containing hydrofluoric acid and nitric acid is particularly effective in removing the residual cerium.

TABLE 10

|  |  | No. 1 | No. 2 | No. 3 | No. 4 | No. 5 |
|---|---|---|---|---|---|---|
| Washing | Hydrofluoric acid | 0.5 |  |  | 0.5 |  |
|  | Nitric acid |  | 5 |  | 5 |  |
|  | Perchloric acid |  |  | 5 |  |  |
|  | Oxalic acid |  |  |  |  | 0.34 |
| Residual cerium (×10 atoms/cm$^2$) |  | 62 | 80 | 146 | 0.8 | 70 |

As described above, a remover of this invention in which a cerium (IV) nitrate salt is combined with a particular acid can adequately dissolve and remove a ruthenium containing metal and can effectively prevent re-adhesion of the removed ruthenium containing metal.

This application is based on Japanese patent application NO.2000–46150 filed on Feb. 23, 2000, the content of which is incorporated hereinto by reference.

What is claimed is:

1. A method of removing a ruthenium-containing metal adhering to a semiconductor substrate, the method comprising the step of removing a ruthenium-containing metal from a semiconductor substrate by applying a remover solution to a portion of a surface of the semiconductor substrate that has the ruthenium-containing metal adhering thereto, the remover solution comprising a cerium (IV) nitrate salt and nitric acid.

2. The method of claim 1, wherein the portion of the surface of the semiconductor substrate to which the remover solution is applied is a periphery of a front face of the semiconductor substrate, the periphery being adjacent to an area of the front face in which a semiconductor device is formed, the periphery not having a semiconductor device formed therein.

3. The method of claim 1, wherein the portion of the surface of the semiconductor substrate to which the remover solution is applied is a rear face of the semiconductor substrate on which a semiconductor device is not formed, the rear face being opposite a front face of the semiconductor substrate in which a semiconductor device is formed.

4. The method of claim 1, after the step of applying the remover solution, further comprising the step of washing the semiconductor substrate with a liquid selected from the group consisting of at least one of hydrofluoric acid, nitric acid, perchloric acid, and oxalic acid to remove residue of the remover solution from the surface of the semiconductor substrate.

5. The method of claim 1, wherein the cerium (IV) nitrate salt is cerium (IV) ammonium nitrate.

6. The method of claim 1, wherein the cerium (IV) nitrate salt is cerium (IV) potassium nitrate.

7. The method of claim 1, wherein the cerium (IV) nitrate salt is 5 to 35 wt % of the remover.

8. The method of claim 1, wherein the remover solution further comprises 35 to 94 wt % water.

9. The method of claim 2, wherein the remover solution is excluded from the area of the front face in which a semiconductor device is formed.

10. The method of claim 3, wherein the remover solution is excluded from the front face in which a semiconductor device is formed.

11. The method of claim 5, wherein the cerium (IV) nitrate salt is 10 to 30 wt % of the remover solution.

12. A method of removing a ruthenium-containing metal adhering to a semiconductor substrate that has a first surface region in which semiconductor devices are formed and a second surface region in which semiconductor devices are not formed and to which the ruthenium-containing metal is adhered, the method comprising the steps of:

rotating the semiconductor substrale; removing the ruthenium-containing metal adhering to the semiconductor substrate by spraying a remover solution onto the second surface region that has the ruthenium-containing metal adhering thereto, the remover solution including comprising a cerium (IV) nitrate salt and nitric acid, while excluding the remover solution from the first surface region; and rinsing the semiconductor substrale to remove residue of the remover.

* * * * *